United States Patent
Karthaus et al.

(10) Patent No.: US 8,384,574 B2
(45) Date of Patent: Feb. 26, 2013

(54) RECONFIGURABLE BANDPASS DELTA-SIGMA MODULATOR

(75) Inventors: Udo Karthaus, Neu-Ulm (DE); Stephan Ahles, Erbach (DE)

(73) Assignee: Ubidyne, Inc., Wilimgton, DE (US)

( * ) Notice: Subject to any disclaimer, the term of this patent is extended or adjusted under 35 U.S.C. 154(b) by 147 days.

(21) Appl. No.: 12/981,722

(22) Filed: Dec. 30, 2010

(65) Prior Publication Data

US 2011/0148679 A1 Jun. 23, 2011

Related U.S. Application Data

(63) Continuation-in-part of application No. PCT/EP2009/056930, filed on Jun. 5, 2009.

(60) Provisional application No. 61/076,843, filed on Jun. 30, 2008.

(30) Foreign Application Priority Data

Jun. 30, 2008 (GB) .................................. 0811896.0

(51) Int. Cl.
*H03H 3/00* (2006.01)

(52) U.S. Cl. .......... 341/143; 455/73; 375/222; 327/149; 327/336; 327/553; 327/103; 331/117 FE

(58) Field of Classification Search .......... 341/143–160; 455/73; 375/222; 327/149, 336, 553, 103, 327/157; 365/512; 331/117 FE
See application file for complete search history.

(56) References Cited

U.S. PATENT DOCUMENTS

| | | | |
|---|---|---|---|
| 5,959,562 A | 9/1999 | Wiesbauer | |
| 6,121,910 A * | 9/2000 | Khoury et al. | 341/143 |
| 6,693,573 B1 | 2/2004 | Linder | |
| 7,034,728 B2 * | 4/2006 | Luh et al. | 341/143 |
| 7,057,541 B1 * | 6/2006 | Kaplan | 341/143 |
| 7,057,741 B1 * | 6/2006 | Mueller et al. | 356/512 |
| 7,301,392 B2 * | 11/2007 | Hinrichs et al. | 327/553 |
| 7,324,036 B2 * | 1/2008 | Petre et al. | 341/155 |
| 7,928,877 B1 * | 4/2011 | Kaplan | 341/143 |
| 7,974,333 B2 * | 7/2011 | Maeda | 375/222 |
| 8,072,363 B2 * | 12/2011 | Yu et al. | 341/143 |
| 2005/0237223 A1 | 10/2005 | Nishiwaki | |
| 2006/0103561 A1 | 5/2006 | Abe et al. | |
| 2006/0119491 A1 | 6/2006 | Gealow et al. | |
| 2010/0248647 A1 * | 9/2010 | Wachi | 455/73 |

FOREIGN PATENT DOCUMENTS

| | | |
|---|---|---|
| GB | 2281828 | 3/1995 |
| GB | 2461510 | 1/2010 |

OTHER PUBLICATIONS

International Search Report & Written Opinion issued in connection with International Patent Application No. PCT/EP2009/056930 on Oct. 15, 2009.

* cited by examiner

*Primary Examiner* — Lam T Mai

(74) *Attorney, Agent, or Firm* — Stephen H. Eland; Dann, Dorfman, Herrell & Skillman

(57) ABSTRACT

A delta-sigma modulator is disclosed which has a filter comprising a filter input, two LC resonators (LC1-1, LC1-2), and two switches (CBT/CGT). An input of each one of the two switches is connected to the filter input and a corresponding output of each one of the two switches is connected to a corresponding one of said LC resonators. Each one of the two switches is individually controllable for selectively connecting the corresponding one of the LC resonators with the filter input. The invention also relates to a method for changing the mode of operation of a delta-sigma modulator.

14 Claims, 5 Drawing Sheets

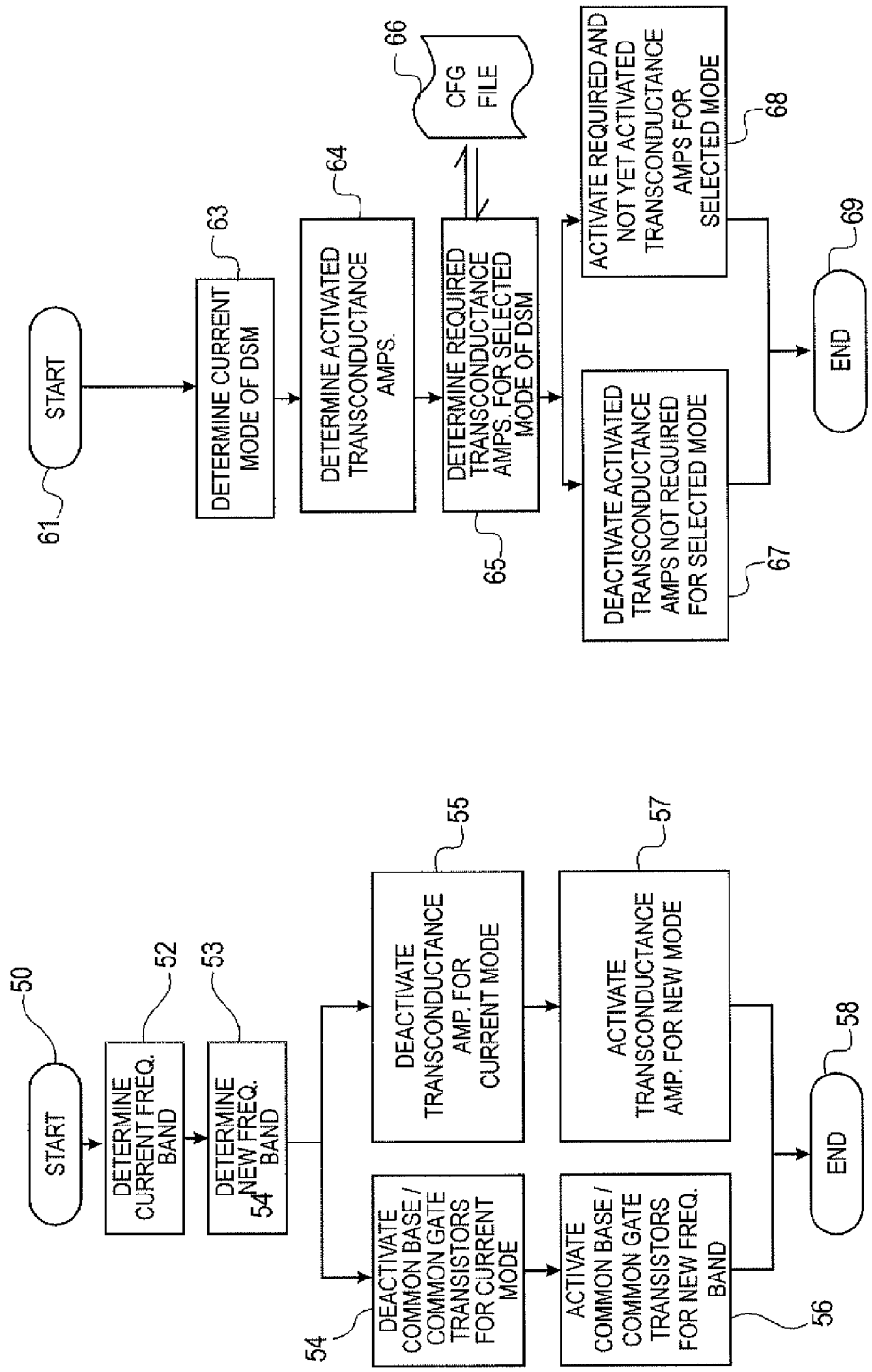

RECONFIGURABLE BANDPASS DELTA-SIGMA MODULATOR

CROSS-REFERENCE TO RELATED APPLICATIONS

This application is a continuation-in-part of International Patent Application No. PCT/EP2009/056930 filed on Jun. 5, 2009 and claiming priority and benefit of GB Patent Application No. 0811896.0, filed on Jun. 30, 2008, and of U.S. Patent Application No. 61/076,843, filed on Jun. 30, 2008. The entire disclosure of each of the foregoing applications is incorporated herein by reference.

SUMMARY OF THE INVENTION

The invention relates to delta-sigma modulators and more particularly to a frequency variable filter in a delta-sigma modulator.

BACKGROUND OF THE INVENTION

Delta-sigma modulators are increasingly used in receivers for mobile communication. Many different standards exist for mobile communication: GSM, UMTS, CDMA2000 etc. Many of these operate at different frequency bands and with different bandwidths. Especially for the receiver part of a mobile telecommunications system this typically means that specific receivers have to be designed for one frequency range and one bandwidth, because of the analogue nature of the received signal. Although it would be possible to completely digitise the analogue signal, this is usually too elaborate for normal applications. It is more efficient to do some analogue filtering first, and then proceed to analogue-to-digital conversion. This is, in principle, what a continuous-time band pass delta-sigma modulator (CT BP DSM) does. The analogue part of the delta-sigma modulator achieves some bandwidth reduction around the centre frequency of interest, and the feedback action of the DSM provides an efficient error reduction, so that at the digital output of the delta-sigma modulator a digital representation of the analogue payload can be expected.

Unfortunately, analogue filters, such as LC resonators or so called tanks, cannot be easily re-tuned to different frequency bands during operation. US Patent Application Publication No. 2005/0237233 A1 proposes a programmable loop filter for use with a sigma-delta analog-to-digital converter and method for programming the same. The loop filters shown in this document comprise resistor-capacitor networks (RC networks) wherein the values of the resistors and the capacitors can be varied. However, accuracy usually suffers so that an exact frequency selection is difficult to achieve. Moreover, the ranges of variation of variable resistors or capacitors are usually not very large (or else accuracy is further degraded). Thus it appears that the programmable loop filter proposed in U.S. Patent Application Publication No. 2005/0237233 A1 could still be improved. The entire disclosure of U.S. Patent Application Publication No. 2005/0237233 A1 is hereby included by reference into the description.

U.S. Patent Application Publication 2006/0119491 A1 describes a dual-mode delta-sigma modulator analogue-to-digital converter system and method that supports two modes of operation. The digital converter system includes a selection unit for permitting the high-frequency resonator circuit and the low-frequency resonator circuit to be employed in a first mode of operation. The system also permits the high-frequency resonator circuit and the feed forward path from the final integrator in the high-frequency resonator circuit to the summer (near the DSM input) to be disabled in a second mode of operation. The digital converter system in U.S. Patent Application Publication 2006/0119491 A1 has a time discrete configuration on its analogue side as opposed to a continuous time configuration. The loop filter is a time discrete filter, as well, that does not contain inductances L or capacitances C. Rather, the loop filter is in the form of a digital filter. The entire disclosure of U.S. Patent Application Publication No. 2006/0119491 A1 is hereby included by reference into the description.

U.S. Pat. No. 6,693,573 discloses a sigma-delta modulator which utilises Micro Electro Mechanical Systemicro electro mechanical system (MEMS) technology coupled with an on-chip LC networks. The MEMS switches of U.S. Pat. No. '573 are used to switch individual ones of capacitors and inductors in and out of the LC network to alter the centre frequency and tuning range of the sigma-delta modulator.

SUMMARY OF THE INVENTION

The disclosure teaches more flexibility to a continuous-time, band pass delta-sigma modulator regarding its filtering action. It would be desirable to maintain satisfactory tuning accuracy when changing the frequency bands.

The disclosure provides a delta-sigma modulator with a filter. The filter comprises a filter input, at least two LC resonators, and at least two switches. An input of one of the at least two switches is connected to the filter input and an output\of one of the two switches is connected to a corresponding one of the at least two LC resonators. One of the at least two switches is individually controllable for selectively connecting the corresponding one of the at least two LC resonators with the filter input.

It will be noted that the delta-sigma modulator of the current disclosure has no switch inside either of the two LC resonators. As, as such, the quality factor Q and noise shaping properties of the delta-sigma modulator are not degraded by series serious resistance of the switches due to the oscillation of the current in the LC resonator.

The filter (or one of the filters) in a delta-sigma modulator is typically arranged in the forward branch of the delta-sigma modulator, i.e. between the point where the feedback signal is subtracted from the input signal and the quantizer. Other positions within the delta-sigma modulator are possible, for example in the analogue part of the feedback loop. In the former case (filter in the forward branch) the filter input receives the difference between the input signal and the feedback signal. Within the filter, the received signal is passed on to components of the filter.

Depending on the selected setting of the two switches either the first resonator or the second resonator is connected to the filter input. Typically, the two switches are switched in a toggled fashion so that only one of the first resonator or the second resonator is active and the other(s) is (are) inactive. Each of the at least two switches can be activated by a control signal provided to a control input of the switch.

Individual ones of the at least two LC resonators can be tuned relatively exactly to a desired tuning frequency, termed a target frequency. It is possible to achieve a large ratio between a selectable one of a high frequency and a low frequency. When switching from one of the LC resonators to another one of the LC resonators, the target frequency is reached virtually immediately, since each of the LC resonators is pre-tuned, thus offering a fast and accurate change of the frequency. There is no need to (slowly) change the tuning frequency by changing e.g. the capacity of a capacitor.

It will be appreciated that the enumeration of two switches and two resonators is non-exhaustive, i.e. there could be three or more common base/gate transistors and three or more resonators. This extension is within the scope of the corresponding patent claims.

In an aspect of the disclosure, the switches are common base/gate transistors (CBT/CGT). The use of common base/gate transistors for the switches means that no different technologies are required for the manufacture of the switches compared to the LC resonator circuit. So, for example, the delta-sigma modulator described in this disclosure can be manufactured using any type of semiconductor process. This is in contrast to the teachings of the prior art U.S. Pat. No. '573 which discloses the use of MEMS technology for the manufacture of switches. Thus the manufacturing process required for the sigma-delta modulator of U.S. Pat. No. '573 requires a semiconductor process which is also capable of supporting MEMS technology.

For activating the common base transistor (bipolar case), the base voltage of the transistor to be activated has to be higher than the base voltage of the other transistor(s), for example by a few hundred mV. This means that the activation state of the common base transistor can be controlled by raising and lowering the base voltage of the common base transistor. The designation "two common base/gate transistor" comprises either one of the following combinations: two common base transistors, two common gate transistors, or one common base transistor and one common gate transistor. A common base transistor has the input at its emitter and the output at its collector. In the delta-sigma modulator described above, the emitter is directly or indirectly connected to the filter input and receives substantially the same signal as the filter input. A transistor that is connected as a common base transistor is well suited for input signals at high frequencies, because its input impedance is relatively low. Another particularity of the common base configuration is the relatively high isolation between the input and the output which reduces feedback from the output back to the input. For this reason, the common base configuration shows a high stability. The above remarks also apply to common gate transistors if a field effect transistor is used instead of a bipolar transistor.

In an aspect of the present disclosure, the delta-sigma modulator is a continuous time band pass delta-sigma modulator. In this type of delta-sigma modulator the analogue side can be designed with true analogue elements, such as LC resonators or so called tanks. For some frequency ranges and/or nature of the analogue radio frequency signal, such a configuration is more appropriate.

In one aspect of the disclosure the filter comprises at least two activatable transconductance amplifiers, an input of one of the at least two activatable transconductance amplifiers being connected to a corresponding one of the at least two LC resonators. A transconductance amplifier accepts a voltage at its input and provides a proportional current at its output. Thus, each transconductance amplifier picks up the voltage at its corresponding LC resonator. The corresponding LC resonator itself is driven by a current that flows through the common base/gate transistor mentioned above.

In another aspect of the disclosure the filter comprises at least two further transconductance amplifiers. The input of the further transconductance amplifiers is connected to a same one of the LC resonator as the input of one of the two transconductance amplifiers. The further transconductance amplifiers bypass a filter section of the filter. The voltage at the LC resonator is picked up by a transconductance amplifier and by a further transconductance amplifier. Depending on which of these two transconductance amplifiers is activated, a proportional current is supplied to a filter section that is immediately downstream of the filter section that comprises the LC resonators, or not, i.e. the filter section situated immediately downstream is bypassed. By bypassing one or more filter section(s) the order of the filter can be changed.

In another aspect of the disclosure, the at least LC resonators are tuned to different frequency bands so that the delta-sigma modulator can be tuned to two different frequencies. Such a configuration can be employed in a continuous time band pass delta-sigma modulator.

In one aspect of the disclosure a first one of the at least two LC resonators is integrated on a principal integrated circuit of the delta-sigma modulator and another one of the two LC resonators is provided off-chip.

In another aspect of the disclosure, the filter further comprises further LC resonators. Individual ones of the individual ones further LC resonators are organised in two or more LC resonator sets. Individual ones of the two or more LC resonator sets are tuned to a different frequency band. The LC resonators that are organised in a particular one of the LC resonator sets are commonly activatable by appropriate common base/gate transistors for ones of the LC resonators. In delta-sigma modulators having two or more cascaded LC resonators, it may be necessary to coordinate the frequency response of the various cascaded LC resonators in order to achieve the desired filtering effect (e.g. centre frequency of the delta-sigma modulator, bandwidth, . . . ). In this case certain pairs or sets of LC resonators need to be activated/deactivated simultaneously, which in turn means that the common base/gate transistors have to be activated/deactivated simultaneously, as well.

The disclosure also teaches a method for changing the mode of operation of a (continuous time band pass) delta-sigma modulator, comprising toggling an activation condition of at least one LC resonator of a filter within the delta-sigma modulator by controlling a corresponding switch that is connected to an input of the filter and to the LC resonator. The method affords higher flexibility for the control of a delta-sigma modulator. The method can be performed while the delta-sigma modulator is operating and relatively rapid changes of the frequency response of the delta-sigma modulator can be made.

In an aspect of the disclosure, the switch is a common base/gate transistor.

In an aspect of the disclosure, toggling an activation condition of a LC resonator further comprises activating or deactivating a corresponding transconductance amplifier that is connected to an output of the LC resonator. Some types of filters in delta-sigma modulators use the addition of electric currents to implement a mathematical "+" function ("plus" function). A transconductance amplifier is useful in these configurations because it converts an input voltage to an output current. Deactivating unused transconductance amplifiers is advisable for obtaining exact results of the addition of electric currents.

In one aspect of the disclosure, the changing the mode of operation comprises changing a frequency band of the delta-sigma modulator by activating a first one of the LC resonators and deactivating a second one of the LC resonators. The capability of changing the frequency band provides more flexibility to the delta-sigma modulator.

In one aspect of the disclosure, changing the mode of operation comprises changing the order of the delta-sigma modulator by changing the selection of the activated ones of the LC resonators. By changing the order of the delta-sigma modulator, different transfer characteristics can be selected. For example the noise-shaping behaviour and/or the dynamic range can be adapted to the needs of a currently selected mode of operation. For example, one mode of operation could be directed to capture weak signals, in which case some concession might have to be made regarding signal quality: For example, a voice signal would be understandable, but the voice might be distorted due to bandwidth compression or strong noise. Another exemplary mode of operation could provide high voice quality when the input signal is strong enough. A low filter order usually provides more robustness.

A reconfigurable delta-sigma modulator as described above can work at one or more frequency ranges and the order of the delta-sigma modulator can be changed. This makes the delta-sigma modulator flexible enough to be used as a part of a receiver for several different communication standards. Mixing (frequency translating) is not necessary (but nevertheless possible) so that problems related to insufficient image suppression and 1/f noise of receivers based on down conversion mixers can be mostly avoided.

These and other aspects of the disclosure will be apparent from and elucidated with reference to the embodiment(s) described herein after.

DESCRIPTION OF THE FIGURES

FIG. 5 shows a flow chart of a method for changing a frequency band of a delta-sigma modulator.

FIG. 6 shows a flow chart of a method for changing the filter order of a delta-sigma modulator.

DETAILED DESCRIPTION OF THE INVENTION

For a complete understanding of the present invention, reference is now made to the following detailed description taken in conjunction with the Figures.

It should be appreciated that the various aspects of the invention discussed herein are merely illustrative of the specific ways to make and use the invention and do not therefore limit the scope of invention when taken into consideration with the claims and the following detailed description. It will also be appreciated that features from one embodiment of the invention may be combined with features from another embodiment of the invention.

The entire disclosure of U.S. Patent Application Publication Nos. 2005/0237233 A1 and 2006/0119491 A1 is hereby incorporated by reference into the description.

An object of the present system is to improve the flexibility of delta-sigma modulators and/or to reduce the size of multi-frequency receivers that comprise delta-sigma modulators.

Figure 1:
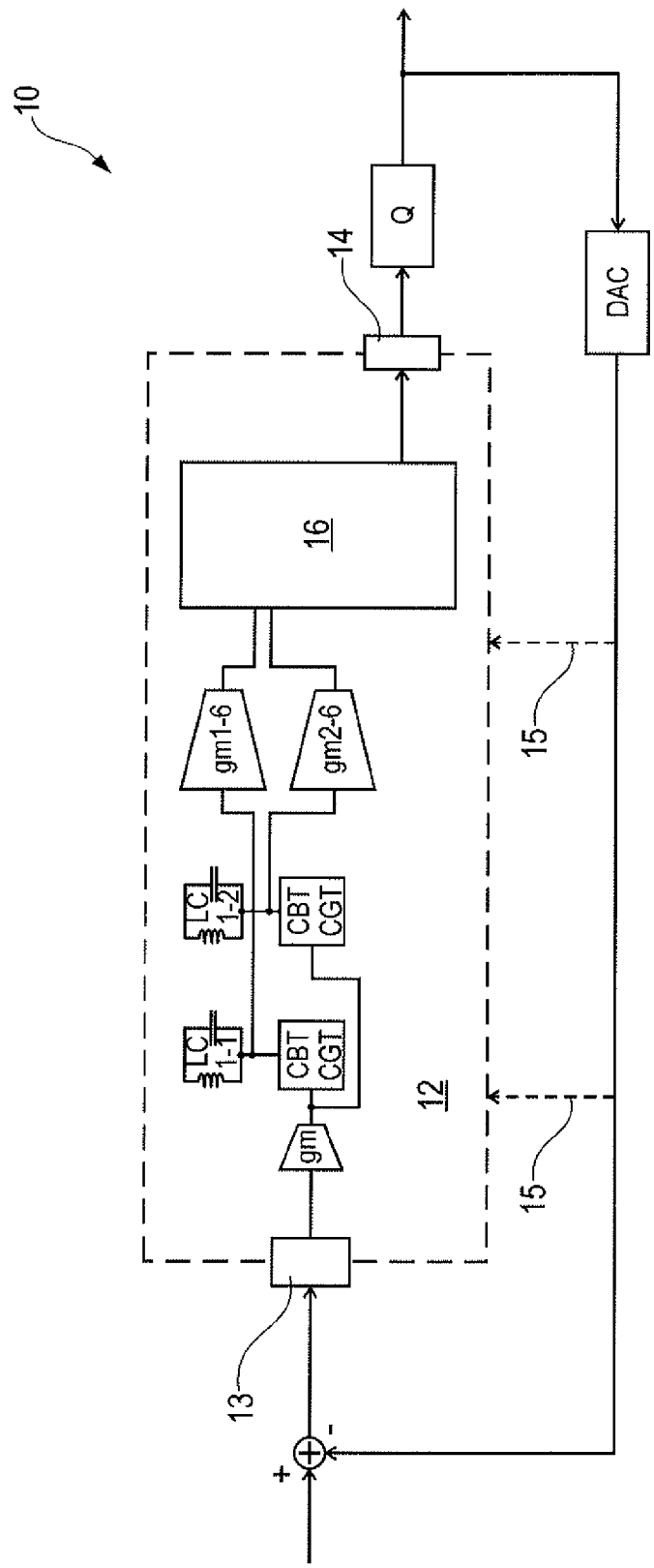
FIG. 1 shows one embodiment of a delta-sigma modulator having selectable LC resonators.

FIG. 1 shows an aspect of a delta-sigma modulator 10 having selectable LC resonators. Delta-sigma modulator (DSM) 10 comprises an input at the left and an output at the right. A DSM input signal first passes a summing point at which a feedback signal is subtracted. The difference signal is passed to a filter input 13 of a filter 12 (dashed box). The details of filter 12 will be described below. A filter output signal is provided at a filter output 14 and passed on to a quantizer Q. The output of the quantizer Q is usually also the output of the delta-sigma modulator 10. Furthermore, the output of quantizer Q is digital-to-analogue converted by a digital-to-analogue converter DAC and then fed back to the summing point as an analogue feedback signal. The feedback signal line could be connected to (a) further filter input(s) 15. Furthermore, the feedback line could comprise a filter, delay elements, or other components.

In the configuration of FIG. 1 the delta-sigma modulator receives the input signal and the feedback signal in a voltage representation. The summer is able to subtract the two voltages to create the filter input signal. Within filter 12 the filter input signal travels from filter input 13 to a transconductance amplifier gm that converts the filter input signal from an electrical voltage representation to an electrical current representation. Instead of a voltage representation of the feedback signal and the DSM input signal a current representation is also possible. The feedback digital-to-analogue converter DAC could then directly produce a corresponding current.

The output of transconductance amplifier gm is connected to two common base/gate transistors CBT/CGT configurations, in particular to the emitters of bipolar transistors that are present in the CBT/CGT configurations, or to the sources of field effect transistors. Further details will be illustrated and discussed in connection with FIG. 4. The collector/drain of each common base/gate transistor is connected to a corresponding LC resonator LC1-1, LC1-2. The reference signs of the LC resonators indicate by the first digit the number of the cascaded stage, i.e. "1" for both, LC1-1 and LC1-2. By the second digit the reference signs indicate which set of resonators the LC resonator belongs to, i.e. to the first set in the case of LC1-1, and to the second set in the case of LC1-2. Each of the LC resonators LC1-1 and LC1-2 is connected to a transconductance amplifier gm1-6 and gm2-6. The reference signs for the transconductance amplifiers are organised as follows: The first digit indicates the number of the LC resonator set. The second number indicates the filter order for which the transconductance amplifier has to be activated. The output currents of transconductance amplifiers gm1-6 and gm2-6 are directed to a box 16 which may represent further filter stages (cf. FIG. 2) or a simple merging point (ohmic contact) at which the two currents (one of which being typically zero due to deactivation of its corresponding transconductance amplifier gm*-6) are combined to be lead to the filter output 14. If box 16 contains one or several further filter stages, the further filter input(s) 15 could be connected to box 16.

Figure 2:
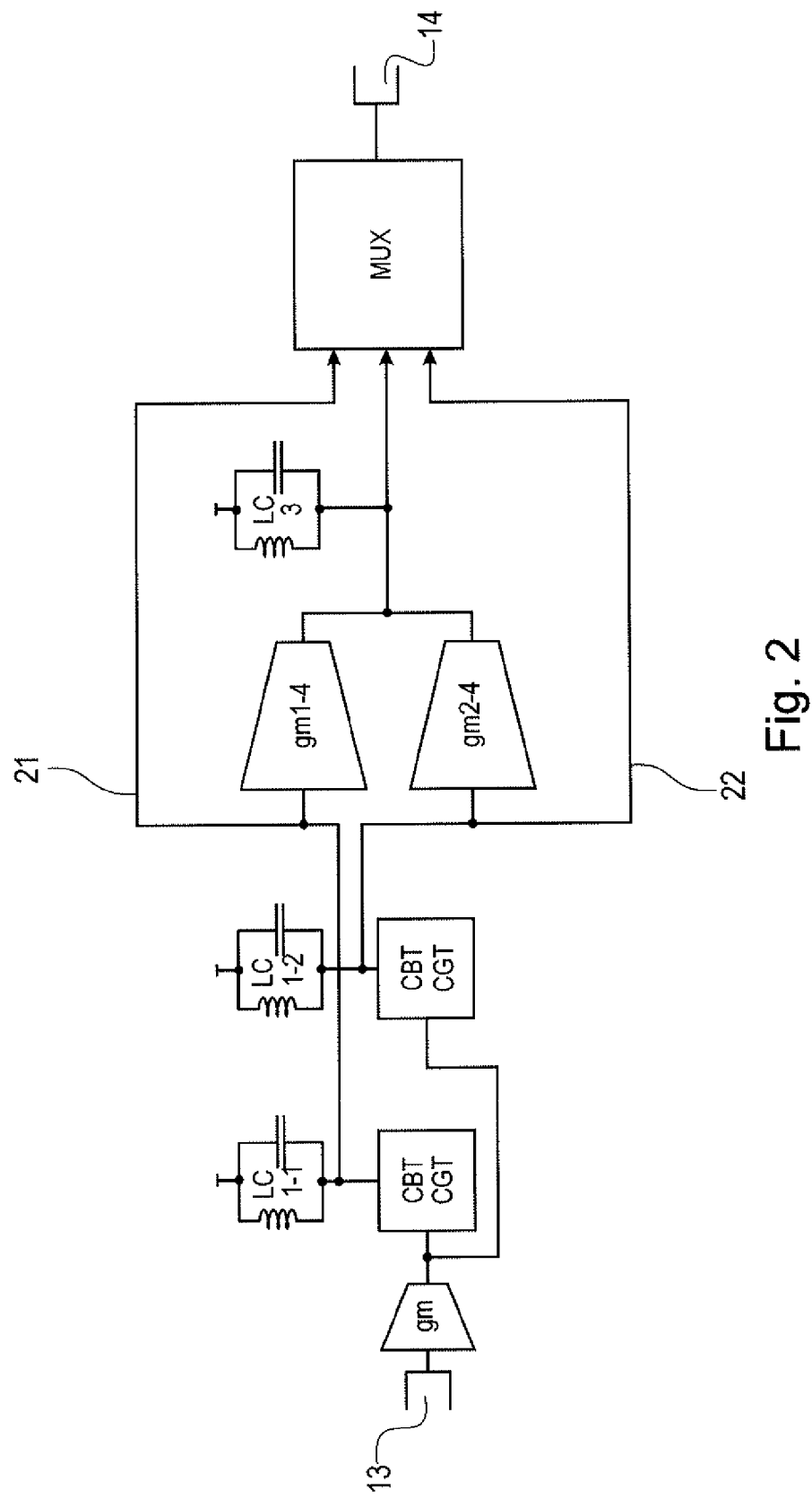
FIG. 2 shows an embodiment of a filter of a delta-sigma modulator having selectable LC resonators and a variable filter order.

FIG. 2 shows an aspect of a filter of a delta-sigma modulator having selectable LC resonators and a variable filter order. FIG. 2 shows the filter from filter input 13 to filter output 14. The left part of FIG. 2 is similar to the corresponding part in FIG. 1. The right part of the filter in FIG. 2 represents a further filter stage that can be bypassed by means of a suitable configuration of transconductance amplifiers. As in FIG. 1, a connection extends from each one of the two first stage LC resonators LC1-1 and LC1-2. The connection from LC1-1 splits up into a connection to transconductance amplifier gm1-4 and into a connection to a multiplexer MUX. The connection from LC1-2 splits up into a connection to transconductance amplifier gm2-4 and into a connection to the multiplexer MUX.

The two transconductance amplifiers gm1-4 and gm2-4 provide for an option to operate the delta-sigma modulator in a fourth order configuration, i.e. with two LC resonators. If for example, the common base/gate transistor belonging to LC1-1 is activated and the transconductance amplifier gm1-4 is activated, then the filter transfer function of the delta-sigma modulator will be determined by the two LC resonators LC1-1 and LC3. In that case the common base/gate transistor belonging to LC resonator LC1-2 and the transconductance amplifier gm2-4 should be deactivated. The output voltage of LC resonator LC3 is passed to the one of the inputs of multiplexer MUX. Multiplexer MUX has to be controlled so that the correct input is selected. By deactivating the left common base/gate transistor, activating the right common base/gate transistor, deactivating transconductance amplifier gm1-4, and activating transconductance amplifier gm2-4, a fourth order combination of LC resonators LC1-1 and LC3 can be set. The selection of a second order filter or a fourth order filter is achieved by activating either the middle input of the multiplexer MUX (fourth order) or one of the upper/lower inputs of the multiplexer MUX (second order), respectively.

If the delta-sigma modulator is to be operated in a second order mode, then LC resonator LC3 is not needed and must be bypassed. This is achieved by the two connections 21 and 22 that connect LC1-1 and LC1-2, respectively, to the multiplexer MUX. In the second order DSM case the two transconductance amplifiers gm1-4 and gm2-4 are deactivated. The appropriate input of multiplexer MUX has to be selected in accordance with the activation state of the common base/gate transistors.

Figure 3:
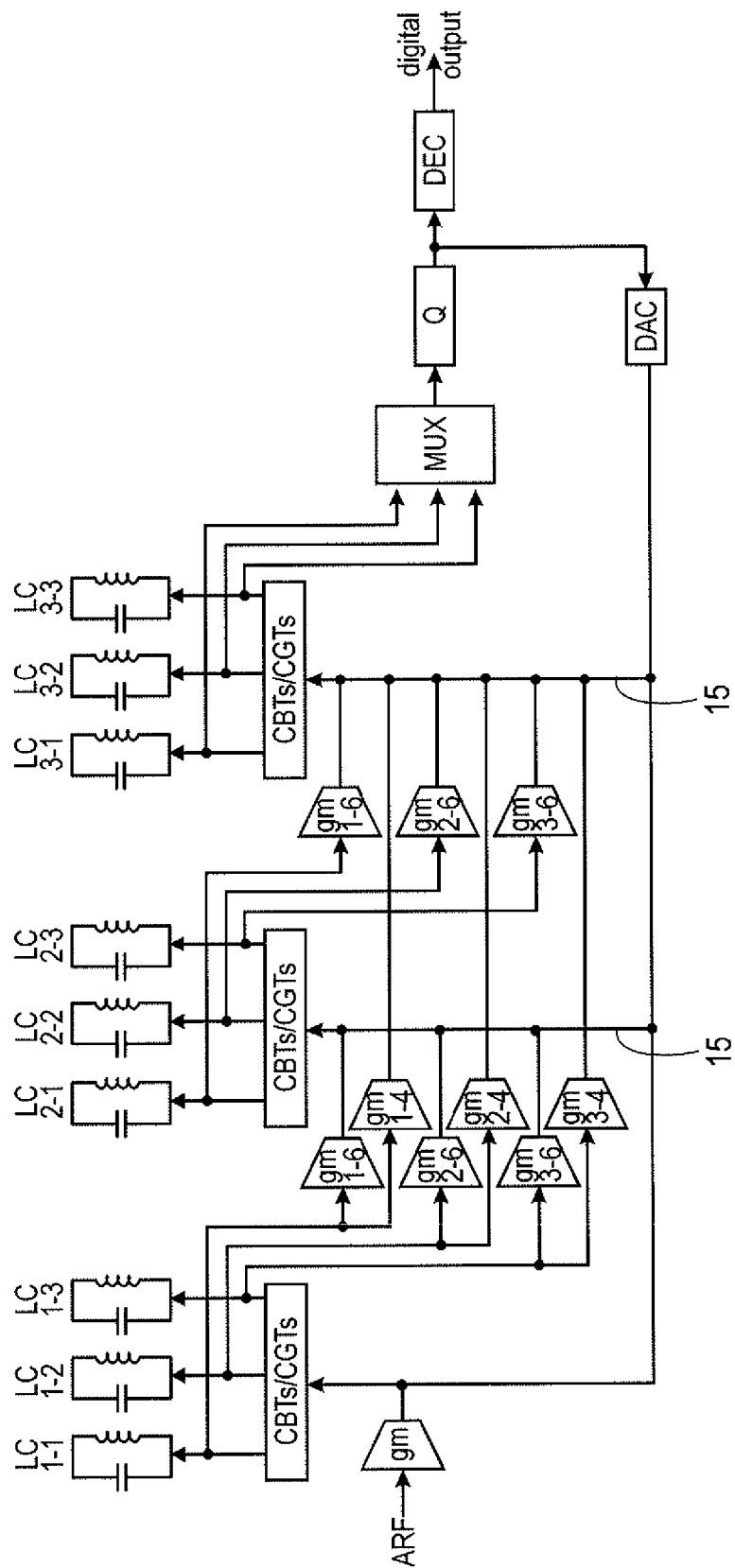
FIG. 3 shows an embodiment of a delta-sigma modulator with three selectable sets of LC resonators and variable filter order.

FIG. 3 shows an aspect of a filter of a delta-sigma modulator with three selectable sets of LC resonators and variable filter order. Compared to the embodiments shown in FIGS. 1 and 2, the embodiment of FIG. 3 has been augmented to support at least three frequency bands and a selection between a fourth order DSM and a sixth order DSM. An analogue radio frequency signal ARF is supplied to the input of the delta-sigma modulator and converted from voltage representation to current representation by transconductance amplifier gm. Current summing is performed downstream of transconductance amplifier gm. The other electrical current to be added is the negative feedback current and here provided by a digital-to-analogue converter DAC, which may also take care of the inversion of the feedback current.

Figure 4:
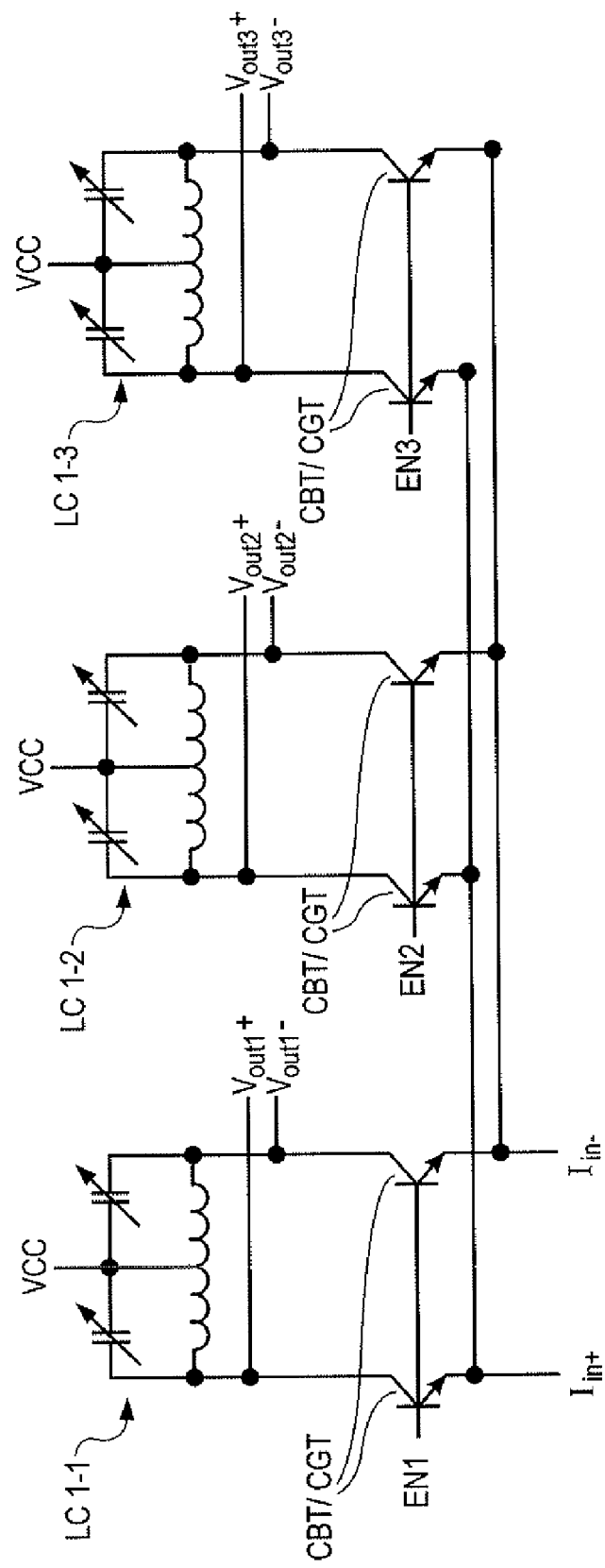
FIG. 4 shows a detail of the LC resonators and their corresponding common base transistors.

The resulting difference current is passed to an array of common base/gate transistors CBTs/CGTs (cf. FIG. 4). Depending on the activation state of the common base/gate transistors in the CBTs/CGTs array, one of the three LC resonators LC1-1, LC1-2, and LC1-3 is activated, i.e. the difference current flows through the resonator and provokes a certain voltage at the resonator which is a function of the difference current and the transfer function of the resonator. The resonator output voltage is tapped by six transconductance amplifiers gm1-6, gm1-4, gm2-6, gm2-4, gm3-6, gm3-4, only one of which usually being activated at a time.

Within the six transconductance amplifiers gm1-6, gm1-4, gm2-6, gm2-4, gm3-6, gm3-4 two groups can be distinguished. The first group comprises transconductance amplifiers gm1-6, gm2-6, and gm3-6 which are the transconductance amplifiers, one of which is used for operating the delta-sigma modulator in sixth order mode. The second group comprises transconductance amplifiers gm1-4, gm2-4, and gm3-4; one of these is used when the delta-sigma modulator is operated in fourth order mode. The transconductance amplifiers of the first group (sixth order mode) provide their output currents to a busbar-like structure that is arranged upstream of a common base/gate transistor array of the second stage of the filter, comprising the LC resonators LC2-1, LC2-2, and LC2-3. The busbar-like structure provides for current summation of electrical currents. The second stage comprises three transconductance amplifiers which also bear the reference signs gm1-6, gm2-6, and gm3-6. These transconductance amplifiers provide their output currents to a second busbar-structure that is arranged upstream of a common base/gate transistor array of the third stage of the filter, comprising the LC resonators LC3-1, LC3-2, and LC3-3. The second busbar-like structure is also fed by the second group of transconductance amplifiers gm1-4, gm2-4, and gm3-4.

The filter shown in FIG. 3 can be operated by choosing one of the following operating modes:

| filter order | reson. set | 1st stage CBTs/CGTs | 2nd stage CBTs/CGTs | 3rd stage CBTs/CGTs | transconductance amplifiers activated |
|---|---|---|---|---|---|
| 4 | 1 | $1^{st}$ transistor | deactivated | $1^{st}$ transistor | gm1-4 |
| 4 | 2 | $2^{nd}$ transistor | deactivated | $2^{nd}$ transistor | gm2-4 |
| 4 | 3 | $3^{rd}$ transistor | deactivated | $3^{rd}$ transistor | gm3-4 |
| 6 | 1 | $1^{st}$ transistor | $1^{st}$ transistor | $1^{st}$ transistor | gm1-6 (both amps.) |
| 6 | 2 | $2^{nd}$ transistor | $2^{nd}$ transistor | $2^{nd}$ transistor | gm2-6 (both amps.) |
| 6 | 3 | $3^{rd}$ transistor | $3^{rd}$ transistor | $3^{rd}$ transistor | gm3-6 (both amps.) |

From the third stage of resonators connections lead to a multiplexer MUX. The input selection is based on whether the first, the second, or the third set of resonators is selected. The output of multiplexer MUX is connected to the quantizer Q of the delta-sigma modulator. As before, the delta-sigma output is used as a feedback signal which is generated by a digital-to-analogue convertor DAC. The feedback line also provides further filter inputs 15.

A decimator DEC is provided at the output of the delta-sigma modulator for providing a decimated digital output.

FIG. 4 shows a detail of the LC resonators and their corresponding common base transistors. In the upper part of FIG. 4, three LC resonators LC1-1, LC1-2, and LC1-3 are illustrated. Each of the LC resonators comprises a adjustable capacitor or a pair of adjustable capacitors, an inductor or a pair of inductors, and a centre tap connected to the supply voltage VCC. An input current is supplied via two terminals $I_{in+}$ and $I_{in-}$ to an array of common base/gate transistors CBT/CGT. Reference is made to the first of the resonators LC1-1. The input current terminals $I_{in+}$ and $I_{in-}$ are connected to the emitter of one of a pair of common base/gate transistors CBT/CGT, respectively. The collector of the common base/gate transistors CBT/CGT is connected to one of the terminals of LC resonator LC1-1. Each of the common base/gate transistors CBT/CGT is controllable by varying the voltage between the base/gate and the emitter (drain) of the transistor. This is achieved by supplying a control signal to terminal EN1 which is connected to the bases of both common base transistors that are in charge of LC resonator LC1-1.

When the voltage between the base and the emitter of the two common base transistors is sufficiently high, the transistor passes into a conducting or amplifying state. Thus the input current $I_{in}$ is supplied to the resonator LC1-1. A voltage that is filtered by the LC resonator LC1-1 can be obtained at the terminals $V_{out1+}$ and $V_{out-}$ which are connected to a transconductance amplifier (not shown in FIG. 4).

The common base/gate transistors shown in FIG. 4 could be part of a cascode transistor arrangement. A cascode is an amplifier having a transconductance amplifier (first stage) and a current buffer (second stage). A cascode has high input-output isolation, high input impedance, high output impedance, high gain, and/or high bandwidth. In a cascode the Miller effect is reduced or even eliminated so that the cascode is well suited for high frequency applications. The other part of the cascode, i.e. the transconductance amplifier is not shown in FIG. 4, but one of them could be connected to one of the input current terminals $I_{in}$, each.

For the resonators of the second set and the third set an analogous description can be made. The activation of the resonator of the second set is controlled by applying an appropriate voltage to terminal EN2, and the activation of the resonator of the third set is controlled by applying an appropriate voltage to terminal EN3. The output voltage terminals are $V_{out2+}$, $V_{out2-}$, and $V_{out3+}$, $V_{out3-}$, respectively.

FIG. 5 shows a flow chart of a method for changing a frequency band of a delta-sigma modulator. The method starts at action 50. The currently selected frequency band is determined in action 52. The new frequency band, i.e. the selected frequency band is determined in action 53. In action 54 the common base/gate transistors for the currently selected frequency band are deactivated. Action 55 is performed substantially synchronously to action 54. In action 55 the transconductance amplifiers for the currently selected frequency band are deactivated. The common base/gate transistor(s) for the new frequency band is/are activated in action 56 and the transconductance amplifier(s) for the new frequency band is/are activated in action 57. The delta-sigma modulator has thus performed a change of the frequency band and the method ends at action 58.

FIG. 6 shows a flow chart of a method for changing the filter order of a delta-sigma modulator. The method starts at action 61. The currently selected mode of the delta-sigma modulator is determined in action 63. The activated ones of the transconductance amplifiers are determined in action 64. Then, in action 65, the required transconductance amplifiers for the selected mode of the delta-sigma modulator are determined. This may be done by querying a configuration file CFG FILE 66. Subsequently, those transconductance amplifiers that are not needed for the selected operating mode are deactivated in action 67. In parallel action 68, those transconductance amplifiers that are required for the newly selected mode, but not yet activated, are activated. The method then ends at action 69.

While various embodiments of the present invention have been described above, it should be understood that they have been presented by way of example, and not limitation. It will be apparent to persons skilled in the relevant arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code, and/or instructions disposed in any form, such as source, object or machine language) disposed, for example, in a computer usable (e.g., readable) medium configured to store the software. Such software can enable, for example, the function, fabrication, modelling, simulation, description and/or testing of the apparatus and methods described herein. For example, this can be accomplished through the use of general programming languages (e.g., C, C++), hardware description languages (HDL) including Verilog HDL, Verilog AMS, VHDL, and so on, or other available programs. Such software can be disposed in any known computer usable medium such as semiconductor, magnetic disk, or optical disc (e.g., CD-ROM, DVD-ROM, etc.). The software can also be disposed as a computer data signal embodied in a computer usable (e.g., readable) transmission medium (e.g., carrier wave or any other medium including digital, optical, or analog-based medium). Embodiments of the present invention may include methods of providing the apparatus described herein by providing software describing the apparatus and subsequently transmitting the software as a computer data signal over a communication network including the Internet and intranets.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage.

It is understood that the apparatus and method described herein may be included in a semiconductor intellectual property core, such as a microprocessor core (e.g., embodied in HDL) and transformed to hardware in the production of integrated circuits. Additionally, the apparatus and methods described herein may be embodied as a combination of hardware and software. Thus, the present invention should not be limited by any of the above-described exemplary embodiments, but should be defined only in accordance with the following claims and their equivalents.

The invention claimed is:

1. A delta-sigma modulator having a filter comprising:
a filter input;
at least two LC resonators; and
at least two switches, an input of one of the at least two switches being connected to the filter input and a corresponding output of each one of the at least two switches being connected to a corresponding one of said at least two LC resonators, and each one of the at least two switches being individually controllable for selectively connecting the corresponding one of the at least two LC resonators with the filter input.

2. The delta-sigma modulator according to claim 1, wherein each one of the at least two switches is a common base/gate transistor.

3. The delta-sigma modulator according to claim 1, characterised in that the delta-sigma modulator is a continuous time band pass delta-sigma modulator.

4. The delta-sigma modulator according to claim 1, wherein the filter comprises at least two activatable transconductance amplifiers, an input of the at least two activatable transconductance amplifiers being connected to a corresponding one of the at least two LC resonators.

5. The delta-sigma modulator according to claim 4, wherein
the filter comprises at least two further transconductance amplifiers, the input of the at least two further transconductance amplifiers being connected respectively to a same one of the at least two LC resonator as the input of one of the at least two transconductance amplifiers, wherein the at least two further transconductance amplifiers bypass a filter section of the filter.

6. The delta-sigma modulator according to claim 1, wherein the at least two LC resonators are tuned to different frequency bands.

7. The delta-sigma modulator according to claim 1, wherein a first one of the at least two LC resonators is integrated on a principal integrated circuit of the delta-sigma modulator and another one of the at least two LC resonators is provided off-chip.

8. The delta-sigma modulator according to claim 1, wherein the filter comprises further LC resonators, the further LC resonators being organised in two or more LC resonator sets, ones of the two or more LC resonator sets being tuned to a different frequency band, and wherein the LC resonators organised in a particular one of the two or more LC resonator sets are commonly activatable by appropriate switches for the LC resonators.

9. A method for changing the mode of operation of a delta-sigma modulator, comprising toggling an activation condition of at least one LC resonator of a filter within the delta-sigma modulator by controlling a corresponding switch connected to an input of the filter and to the at least one LC resonator to controllably electrically connect and disconnect the input of the filter and the at least one LC resonator.

10. The method according to claim 9, wherein the switch is a common base/gate transistor.

11. The method according to claim 9, wherein the toggling the activation condition of the at least one LC resonator further comprises one of activating or deactivating a corresponding transconductance amplifier connected to an output of said at least one LC resonator.

12. The method according to claim 9, wherein the changing of a mode of operation comprises changing a frequency band of the delta-sigma modulator by activating a first one of the at least one LC resonator and deactivating a second one of the at least one LC resonator.

13. The method according to claim 9, wherein a changing of the mode of operation comprises changing an order of the sigma-delta modulator by changing a selection of the activated ones of the at least one LC resonators.

14. A computer program product embodied on a non-transitory computer-readable medium executable by a processor or computer and comprising executable instructions for controlling a delta-sigma modulator according to the steps of:
controlling a switch connected to an input of a filter within the delta-sigma modulator, wherein the switch is connected to at least one LC resonator of the filter; and
toggling an activation condition of the at least one resonator in response to the step of controlling a switch, thus controllably electrically connecting and disconnecting the input of the filter and the at least one LC resonator.

* * * * *